(12) United States Patent
Zelder (10) Patent No.: US 9,291,644 B2
(45) Date of Patent: Mar. 22, 2016

(54) CONTACTLESS MEASURING SYSTEM FOR CONTACTLESS DECOUPLING OF A SIGNAL RUNNING ON A SIGNAL WAVEGUIDE

(71) Applicant: ROSENBERGER HOCHFREQUENZTECHNIK GMBH & CO. KG, Fridolfing (DE)

(72) Inventor: Thomas Zelder, Luneburg (DE)

(73) Assignee: Rosenberger Hochfrequenztechnik GmbH & Co. Kg., Fridolfing (DE)

( * ) Notice: Subject to any disclaimer, the term of this patent is extended or adjusted under 35 U.S.C. 154(b) by 0 days.

(21) Appl. No.: 14/309,046

(22) Filed: Jun. 19, 2014

(65) Prior Publication Data

US 2014/0300381 A1    Oct. 9, 2014

Related U.S. Application Data

(63) Continuation of application No. 12/671,848, filed as application No. PCT/EP2008/006098 on Jul. 24, 2008, now Pat. No. 8,803,538.

(30) Foreign Application Priority Data

Aug. 3, 2007   (DE) ..................... 20 2007 010 784 U (51) Int. Cl.
| | |
|---|---|
| G01R 1/067 | (2006.01) |
| G01R 1/07 | (2006.01) |
| G01R 27/32 | (2006.01) |
| G01R 1/24 | (2006.01) |
| G01R 31/28 | (2006.01) |
| G01R 31/312 | (2006.01) |
| G01R 31/315 | (2006.01) |
| G01R 35/00 | (2006.01) |

(52) U.S. Cl.
CPC .......... *G01R 1/07* (2013.01); *G01R 27/32* (2013.01); *G01R 1/24* (2013.01); *G01R 31/2822* (2013.01); *G01R 31/312* (2013.01); *G01R 31/315* (2013.01); *G01R 35/005* (2013.01)

(58) Field of Classification Search
CPC ........... G01R 1/06772; G01R 1/06711; G01R 1/0735; G01R 1/24; G01R 27/32; G01R 31/2822; G01R 31/312; G01R 31/315; G01R 35/005; G01R 1/045; G01R 1/06744; G01R 1/07; G01R 1/073; H01L 2924/3011; G06F 3/04815; H04L 1/004; G01Q 10/045; G01Q 60/363; G01Q 60/58
See application file for complete search history.

(56) References Cited

U.S. PATENT DOCUMENTS

| | | | | |
|---|---|---|---|---|
| 5,124,660 | A * | 6/1992 | Cilingiroglu | 324/538 |
| 6,870,438 | B1 * | 3/2005 | Shino et al. | 333/26 |
| 8,121,574 | B2 * | 2/2012 | Zelder | 455/292 |

* cited by examiner

*Primary Examiner* — Vinh Nguyen
(74) *Attorney, Agent, or Firm* — DeLio, Peterson & Curcio, LLC; Robert Curcio (57) ABSTRACT

A contactless measuring system having at least one test probe forming part of a coupling structure for the contactless decoupling of a signal running on a signal waveguide, wherein the signal waveguide is designed as a conductor of the electric circuit on a circuit board and as part of an electric circuit. To this end, at least one contact structure is configured and disposed on the circuit board such that said contact structure is galvanically separated from the signal waveguide, forms part of the coupling structure, is displaced completely within the near field of the signal waveguide, and has at least one contact point, which may be electrically contacted by a contact of the test probe.

13 Claims, 5 Drawing Sheets

CONTACTLESS MEASURING SYSTEM FOR CONTACTLESS DECOUPLING OF A SIGNAL RUNNING ON A SIGNAL WAVEGUIDE

This application is a Continuation of application Ser. No. 12/671,848, filed on Jul. 1, 2011, now U.S. Pat. No. 8,803,538, filed as application No. PCT/EP2008/006098 on Jul. 24, 2008.

BACKGROUND OF THE INVENTION

1. Field of the Invention

The present invention relates to a contactless measuring system comprising at least one test probe forming part of a coupling structure for contactless decoupling of a signal running on a signal waveguide, wherein the signal waveguide is configured as a conductor track and as part of an electric circuit on a circuit board of the electrical circuit. The invention also relates to a calibration substrate for a contactless measuring system comprising at least one test probe forming part of a coupling structure for contactless decoupling of a signal running on a signal waveguide, wherein at least one calibration element, in particular a short-circuit standard, an open circuit standard, a resistance standard, or a conductor standard is provided on the calibration substrate, wherein the at least one calibration element is electrically connected to at least one signal waveguide, in particular a microstrip transmission line or a coplanar waveguide.

2. Description of Related Art

The determination of scattering parameters of electrical components embedded within a complex circuit by means of a contactless vector network analysis is known, for example from T. Zelder, H. Eul, "Contactless network analysis with improved dynamic range using diversity calibration", Proceedings of the 36$^{th}$ European Microwave Conference, Manchester, UK, pages 478 to 481, September 2006 or T. Zelder, H. Rabe, H. Eul, "Contactless electromagnetic measuring system using conventional calibration algorithms to determine scattering parameters", Advances in Radio Science—Kleinheubacher Berichte 2006, vol. 5, 2007. Compared with conventional contact-bound network analysis methods, the internal directional couplers of a network analyzer are replaced with contactless near field measuring probes which are directly connected to the vectorial measuring points of the analyzer. The measuring probes are positioned over the signal lines of the object being measured. The probes can act inductively and/or capacitively on the electromagnetic field of the planar conductor. In order to measure the scattering parameters, conventional calibration methods are used, such as are used for contact-bound network analysis.

In contactless vector network analysis, for each measuring port of an unknown test object (DUT—Device Under Test), at least one measuring probe, for example, a conductor loop or two capacitive probes are needed. It is known from, for example, F. De Groote, J. Verspecht, C. Tsironis, D. Barataud and J.-P. Teyssier, "An improved coupling method for time domain load-pull measurements", European Microwave Conference, vol. 1, pages 4 ff., October 2005, to use contactless conductor loops made from coaxial semi-rigid lines. By contrast, it is known from T. Zelder, H. Eul, "Contactless network analysis with improved dynamic range using diversity calibration", Proceedings of the 36$^{th}$ European Microwave Conference, Manchester, UK, pages 478 to 481, September 2006 or T. Zelder, H. Rabe, H. Eul, "Contactless electromagnetic measuring system using conventional calibration algorithms to determine scattering parameters", Advances in Radio Science—Kleinheubacher Berichte 2006, vol. 5, 2007, to use exclusively capacitive probes in contactless measuring systems. From T. Zelder, I. Rolfes, H. Eul, "Contactless vector network analysis using diversity calibration with capacitive and inductive coupled probes", Advances in Radio Science—Kleinheubacher Berichte 2006, vol. 5, 2007 and J. Stenarson, K. Yhland, C. Wingqvist, "An in-circuit noncontacting measurement method for S-parameters and power in planar circuits", IEEE Transactions on Microwave Theory and Techniques, vol. 49, No. 12, pages 2567 to 2572, December 2001, measuring systems are known which are realized with a combination of capacitive and inductive probes.

Although contactless vector network analysis has the potential of characterizing components contactlessly, to date no contactless scattering parameter measurement of HF and microwave components embedded within a circuit has been performed. If measurements are to be made within a circuit, the positions of the contactless probes must be changed during and after the calibration. However, this implies a high level of complexity in order to reproduce the test probe positions during measurement of the calibration standard and of the test object, since the smallest deviations in the probe positioning lead to significant measuring errors.

SUMMARY OF THE INVENTION

Bearing in mind the problems and deficiencies of the prior art, it is therefore an object of the present invention to provide a contactless measuring system of the aforementioned type such that expensive and complex positioning of coupling probes can be dispensed with.

Still other objects and advantages of the invention will in part be obvious and will in part be apparent from the specification.

The above and other objects, which will be apparent to those skilled in the art, are achieved in the present invention which is directed to a contactless measuring system comprising at least one test probe forming part of a coupling structure for contactless decoupling of a signal running on a signal waveguide, including having said signal waveguide configured as a conductor track and as part of an electrical circuit on a circuit board, such that at least one contact structure is configured and arranged on the circuit board, galvanically separated from the signal waveguide, forming part of the coupling structure, arranged completely within a near field of the signal waveguide, and comprising at least one contact point which can be electrically contacted by a contact of said at least one test probe.

In a second aspect, the present invention is directed to a calibration substrate for a contactless measuring system, comprising at least one test probe which forms part of a coupling structure for contactless decoupling of a signal running on a signal waveguide, wherein at least one calibration element, in particular a short-circuit standard, an open circuit standard, a resistance standard, or a conductor standard, is provided on the calibration substrate, wherein the at least one calibration element is electrically connected to at least one signal waveguide, in including a microstrip transmission line or a coplanar waveguide, such that the calibration substrate is configured as a circuit board on which at least one contact structure is configured and arranged such that said at least one contact structure is galvanically separated from the at least one signal waveguide, forms part of the coupling structure, is arranged completely within a near field of the at least one signal waveguide, and comprises at least one contact point which can be electrically contacted by a contact of the at least one test probe.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-15 of the drawings in which like numerals refer to like features of the invention.

The aim of the present invention is achieved with a contactless measuring system of the aforementioned type and with a calibration substrate of the aforementioned type, both having the characterizing features delineated in the claims. Advantageous embodiments of the invention are also described in the claims.

With a contactless measuring system of the aforementioned type, it is provided according to the invention that at least one contact structure is configured and arranged on the circuit board such that said contact structure is galvanically separated from the signal waveguide, forms part of the coupling structure, is arranged completely within the near field of the signal waveguide, and comprises at least one contact point which can be electrically contacted by a contact of a test probe.

This has the advantage that the contact structure and thus the whole coupling structure has a precisely defined geometrical arrangement relative to the signal waveguide, wherein manual positioning of the coupling structure can be dispensed with. Reproducible coupling between the signal waveguide and the coupling structure can be easily achieved.

Suitably, the contact structure is configured as a conductor track on the circuit board.

Particularly good signal coupling can be achieved in that the contact structure is configured so that said contact structure can be contacted by a test probe in an impedance-controlled manner.

At least one contact structure is configured, for example, as a coupling waveguide with an inner conductor and an outer conductor, or as at least one contact point or contact surface for a contact of a test probe.

Suitably, the contact structure and/or the signal waveguide is configured as printed conductor tracks on the circuit board.

For example, the circuit board is configured as a printed circuit board (PCB) or a wafer.

Optimal directional damping or a port with wide-band insulation is achieved in that the contact structure is configured as a waveguide, wherein the ratio of the inductive to the capacitive coupling factor is equal to the product of the wave impedances of the individual waveguides of the contact structure.

In an exemplary embodiment, the coupling structure has at least one, and in particular two, contact structures per measuring port.

In a preferred embodiment, the circuit board is a multi-layer board with a plurality of substrate layers, wherein the signal waveguide is configured on a first substrate layer of the multi-layer board and at least one contact structure is configured on the first or at least one other substrate layer of the multi-layer board.

As an example, at least two of the contact structures are arranged on different substrate layers of the multi-layer board.

In a particularly preferable embodiment, the at least one contact structure has contact points which are configured and arranged such that contacting with on-wafer or PCB test probes results in an impedance-controlled interface.

For rapid and simple calibration of the contactless measuring system, also arranged on the circuit board is at least one calibration element, which is connected to at least one signal waveguide on which at least one contact structure is arranged such that the arrangement of the contact structure on the signal waveguide of a calibration element corresponds to the arrangement of the contact structures on the signal waveguides of the electrical circuit.

At least one calibration element is connected to a number of signal waveguides which corresponds to the number of measuring ports of the contactless measuring system.

In order to provide the calibration elements and the electrical circuit with identical coupling conditions and optimum calibration, at least one contact structure on the signal waveguides of the calibration elements, said contact structure being assigned to a measuring port of the contactless measuring system, is configured identically to the at least one contact structure on the signal waveguides of the electrical circuit, said contact structure being assigned to said measuring port of the contactless measuring system.

With a calibration substrate of the aforementioned type it is provided, according to the invention, that the calibration substrate is configured as a circuit board, on which at least one contact structure is configured and arranged such that this contact structure is galvanically separated from the signal waveguide, forms part of the coupling structure, is arranged completely within the near field of the signal waveguide and has at least one contact point which is electrically contactable with a contact of a test probe.

This brings the advantage that the contact structure, and thus the overall coupling structure, has a precisely defined geometrical arrangement to the signal waveguide, wherein manual positioning of the coupling structure can be dispensed with. Reproducible coupling between the signal waveguide and the coupling structure is achieved by simple means.

The contactless measuring system is preferably configured as described above, wherein it is particularly preferable that at least one contact structure on the signal waveguides of the calibration elements, said contact structure being assigned to a measuring port of the contactless measuring system, is configured identically to the at least one contact structure on the signal waveguides of the electrical circuit, said contact structure being assigned to said measuring port of the contactless measuring system.

At least one calibration element is connected to a number of signal waveguides which corresponds to the number of measuring ports of the contactless measuring system.

Suitably, on the circuit board of the calibration substrate, at least one electrical circuit is configured with at least one signal waveguide on which at least one contact structure is arranged such that the arrangement of the contact structure on the signal waveguide corresponds to the arrangement of the contact structures on the signal waveguides of a calibration element.

In a preferred embodiment, at least one contact structure on the signal waveguides of the calibration elements, said contact structure being assigned to a measuring port of the contactless measuring system, is configured identically to the at least one contact structure on the calibration substrate on the signal waveguides of the electrical circuit, said contact structure being assigned to said measuring port of the contactless measuring system.

Figure 1:
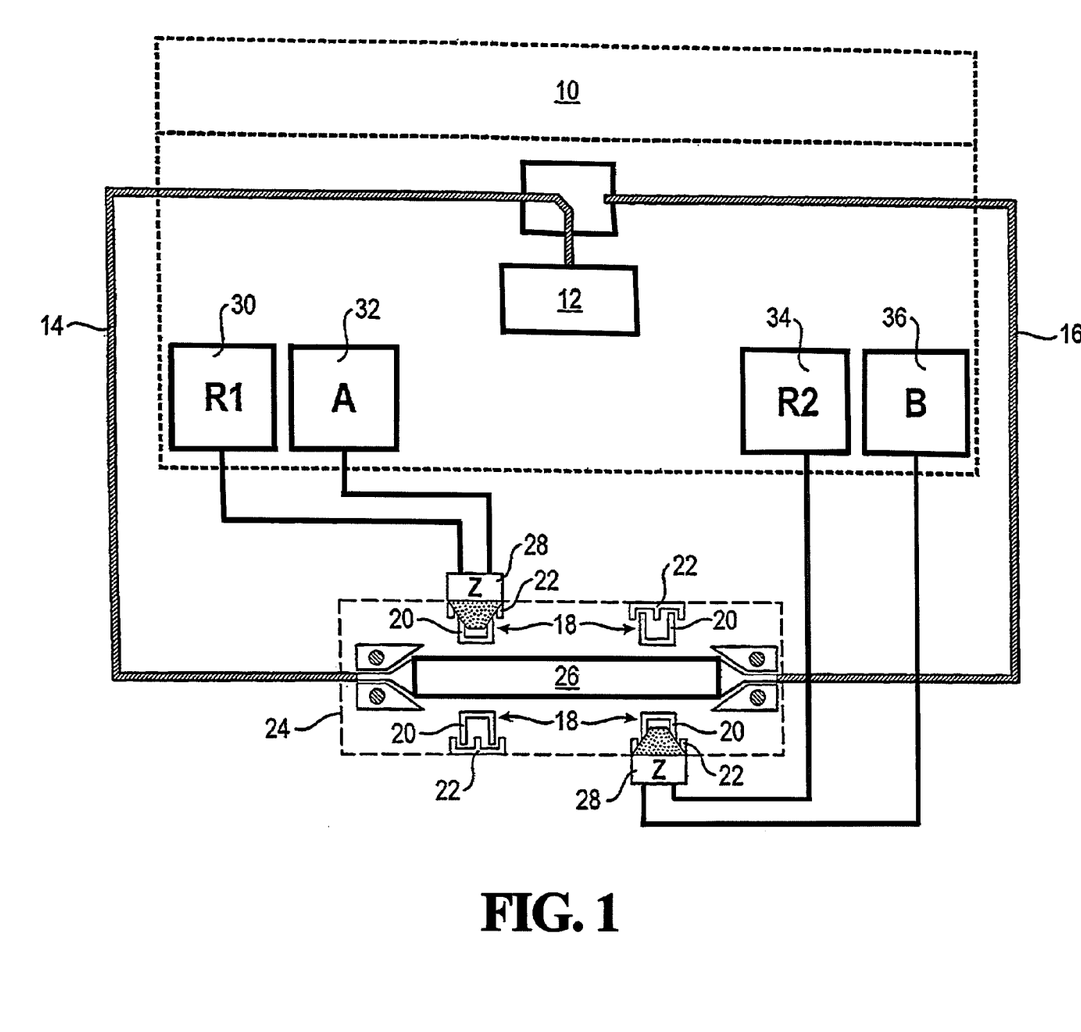
FIG. 1 shows a schematic block circuit diagram of a preferred embodiment of a contactless measuring system according to the invention with a vector network analyzer.

The preferred embodiment of a contactless measuring system according to the invention shown in FIG. 1 comprises a vector network analyzer 10 having a signal source 12, signal lines 14 and 16 and a contact structure with four coupling waveguides 18, each of which has an inner conductor 20 and an outer conductor 22. The coupling waveguides 18 are configured as printed conductor tracks on a printed circuit board 24. Also arranged on this printed circuit board 24 is a signal waveguide 26 configured as a printed conductor track. The signal waveguide 26 is part of an electronic circuit (not shown in detail) provided on the printed circuit board 24 with corresponding electronic components.

The coupling waveguides 18 together with a test probe 28 form a coupling structure for the contactless measuring system in order to decouple contactlessly an electromagnetic wave running along the signal waveguide 26. The test probes 28 each create an electrical contact with a coupling waveguide 18 on one side, and with the measuring ports 30, 32, 34, 36 of the vector network analyzer 10 on the other side.

The coupling waveguides 18 can be shaped almost arbitrarily. It is particularly advantageous for the coupling waveguides 18 to be configured in an impedance-controlled manner, such that the characteristic wave impedance values of the arrangement are known and are optimized for low reflection. The advantage of an impedance-controlled contact structure lies therein that optimum directional damping and a port which is insulated over a broad bandwidth can be achieved.

Figure 2:
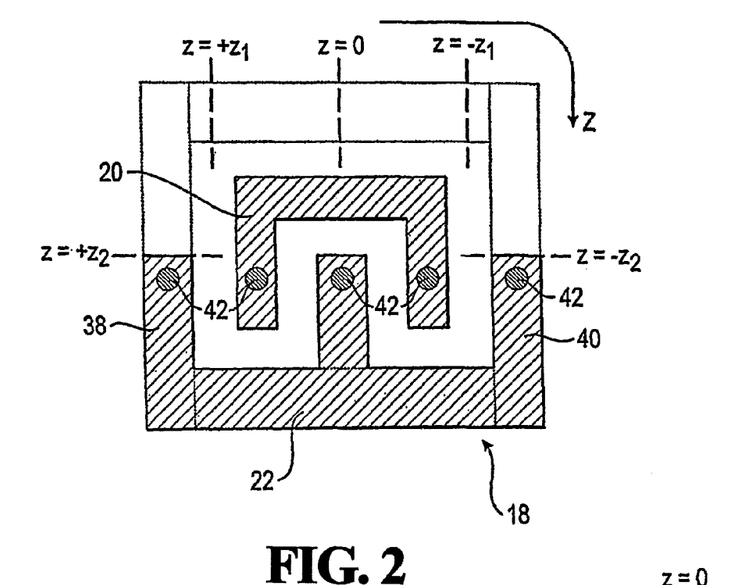
FIG. 2 shows a first preferred embodiment of a contact structure for the contactless measuring system according to the invention.
Figure 3:
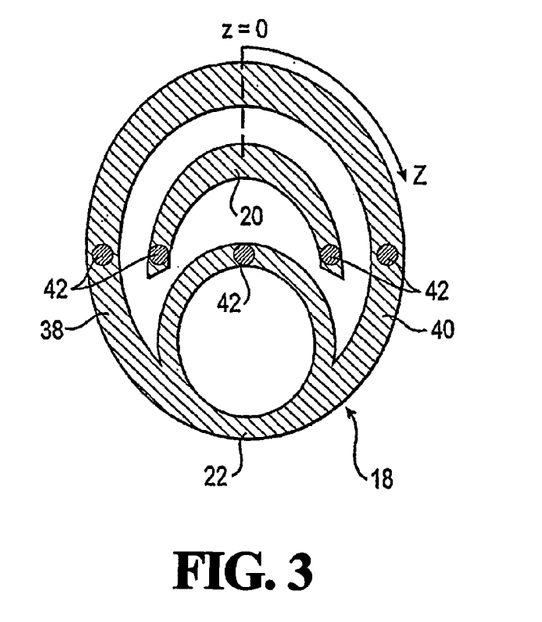
FIG. 3 shows a second preferred embodiment of a contact structure for the contactless measuring system according to the invention.

Two examples of an impedance-controlled coupling waveguide 18 of this type are shown in FIGS. 2 and 3. The coupling waveguide 18 shown in FIG. 2 comprises a U-shaped inner conductor 20 and an outer conductor 22. The outer conductor 22 can be variously configured. Firstly, the outer conductor 22 can be closed, i.e. the outer conductor arms 38 and 40 close at the coordinate z=0, as indicated in FIG. 2 with dashed lines and secondly, the ends of the outer conductor arms 38, 40 can be separated along z. For example, the arms 38, 40 then end at the positions $+z_1$ and $-z_1$ or, as shown in FIG. 2, at the positions $+z_2$ and $-z_2$. Through the arrangement of the outer conductor 22 relative to the inner conductor 20, the coupling waveguide 18 corresponds to a bent coplanar waveguide. Different variants of this coupling waveguide 18 are possible. A variant without corners is shown in FIG. 3. By way of example here, the outer conductor arms 38 and 40 are joined to one another at the position z=0.

A further advantage of the contact structure according to the invention is that no through contacts to earth (rear-sided base metalizing of the circuit board 24) are necessary. However, the possibility of connecting the outer conductors 22 of the coupling waveguides 18 to earth with through contacts is not ruled out.

For decoupling energy from the signal waveguide 26 of a test object (DUT—Device Under Test) at least one contact structure or coupling waveguide 18 is brought into the near field of the respective signal waveguide 26. The coupling waveguide 18 can be situated on the same substrate as the respective signal waveguide 26, or in the case of a multi-layer board, on another substrate. The contact structure with the coupling waveguides 18 is then connected, for example, to a commercial symmetrical on-wafer or PCB test probe. The reference sign 42 in FIGS. 2 and 3 denotes the contact positions of the contacts of test probes with the contact structure or the respective coupling waveguide 18. In order to characterize an N-port test object, at least N coupling waveguides 18 situated within the near field of the N signal waveguides 26 are needed. FIG. 1 shows the example of a 2-port test object (in this case, a simple conductor=DUT) with four coupling waveguides 18.

The geometry of the coupling waveguides 18 and of the test probes 28 both influence the coupling factor of the arrangement. The test probes 28 are connected to (vectorial) receivers of, for example, a conventional network analyzer, as shown in FIG. 1.

The procedure for measuring test objects embedded within planar circuits with the aid of at least one impedance-controlled contact structure or at least one non-impedance-controlled contact structure within planar circuits will now be described.

The method is essentially based on the method of contactless vector network analysis. The disadvantage of contactless vector network analysis is that the use of the method for achieving accurately measured values is very heavily dependent on the positioning accuracy of the contactless test probes. According to the invention, it is also provided that printed contact structures are used in combination with conventional test probes, rather than a complex automatic positioning system in combination with completely contactless probes. All the signal lines of the test objects and of the calibration elements which are necessary for system error calibration, must be provided with at least one coupling waveguide 18 (contact structure).

Figure 4:
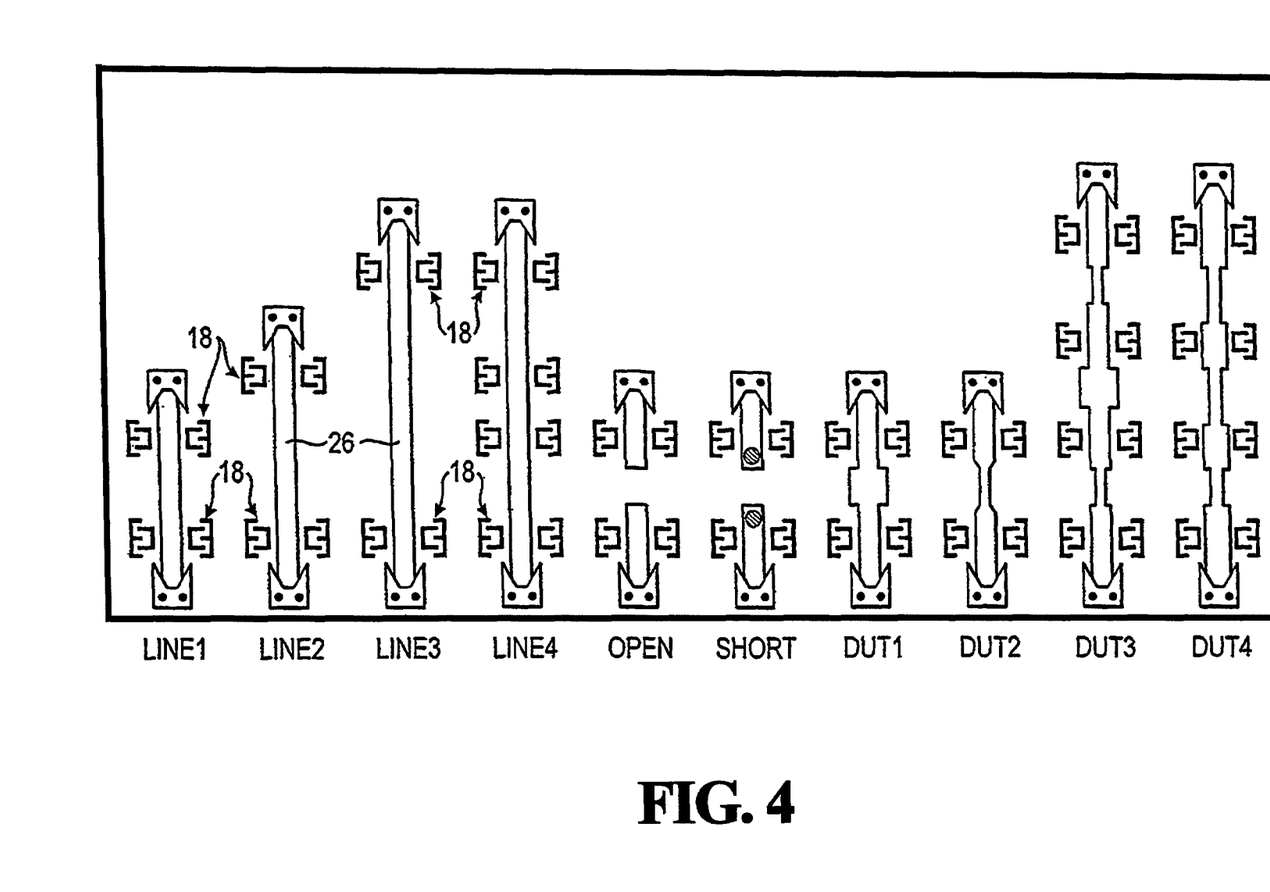
FIG. 4 shows a first preferred embodiment of a calibration substrate according to the invention for the contactless measuring system according to the invention in plan view.
Figure 5:
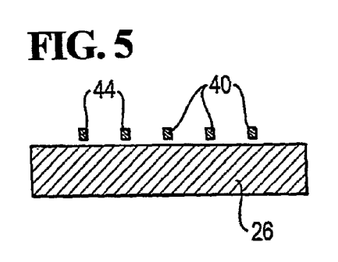
FIG. 5 shows an exemplary alternative embodiment of a contact structure for the contactless measuring system according to the invention.
Figure 6:
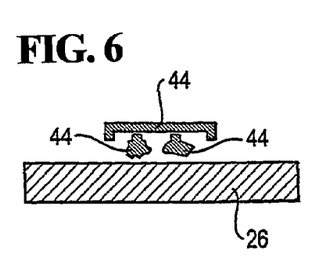
FIG. 6 shows a further exemplary alternative embodiment of a contact structure for the contactless measuring system according to the invention.
Figure 7:
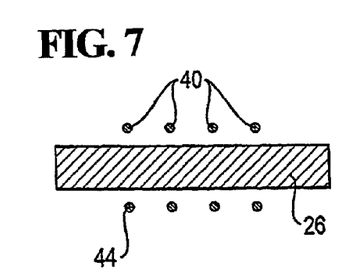
FIG. 7 shows a further exemplary alternative embodiment of a contact structure for the contactless measuring system according to the invention.
Figure 8:
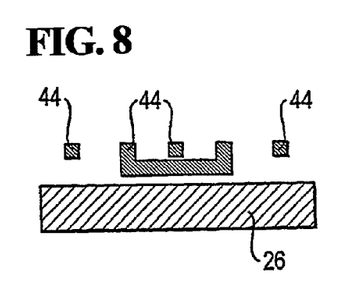
FIG. 8 shows a further exemplary alternative embodiment of a contact structure for the contactless measuring system according to the invention.
Figure 9:
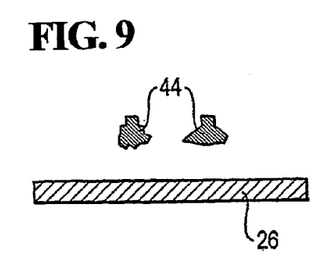
FIG. 9 shows a further exemplary alternative embodiment of a contact structure for the contactless measuring system according to the invention.
Figure 10:
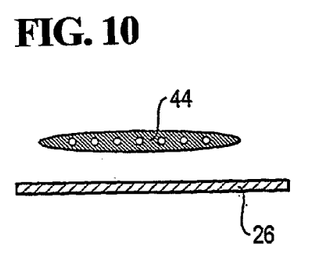
FIG. 10 shows a further exemplary alternative embodiment of a contact structure for the contactless measuring system according to the invention.
Figure 11:
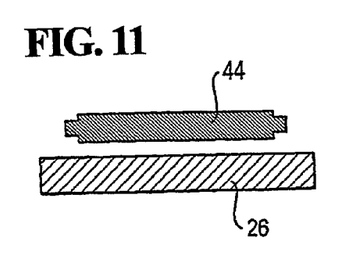
FIG. 11 shows a further exemplary alternative embodiment of a contact structure for the contactless measuring system according to the invention.
Figure 12:
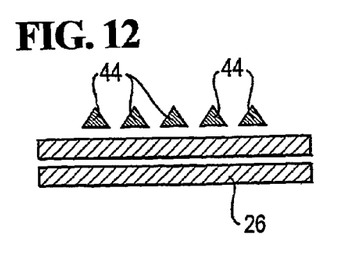
FIG. 12 shows a further exemplary alternative embodiment of a contact structure for the contactless measuring system according to the invention.
Figure 13:
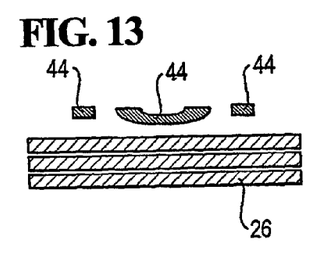
FIG. 13 shows a further exemplary alternative embodiment of a contact structure for the contactless measuring system according to the invention.

An example of a practical implementation of a calibration substrate with embedded test objects (DUT3, DUT4) making use of contact structures with printed coupling waveguides 18 is shown in FIG. 4. For 2-port calibration, the contact structure comprises two coupling waveguides 18 for each signal waveguide 26, said coupling waveguides being configured, for example, according to the embodiment of FIG. 2. For N-port calibration, a contact structure with at least N coupling waveguides 18 per signal waveguide 26 is necessary. When using a diversity calibration method, it is also useful to utilize a contact structure with more than N coupling waveguides 18 per signal waveguide 26.

Due to the small dimensions of the coupling waveguides 18, for example, on-wafer or PCB test probes can be reproducibly positioned on the identical coupling waveguides 18 of the individual calibration elements (LINE1, LINE2, LINE3, LINE4, OPEN, SHORT). Once the system has been calibrated, the scattering parameters of, for example, embedded components can be determined. However, the signal lines of the components must have the same properties (geometry, wave impedance, etc.) as those of the calibration elements. In addition, the same contact structure must be present on the planar circuit at every signal waveguide 26 of the embedded test object (DUT) as used for the calibration.

The method therefore involves the placement of a contact structure, for example, in the form of a coupling waveguide 18 within the near field of the signal waveguide 26 of the calibration and test objects on a circuit board 24. The coupling waveguides 18 are arranged and configured on the circuit board 24 such that they barely disrupt the function of a circuit and also can be connected to, for example, conventional on-wafer or PCB test probes.

FIGS. 5 to 13 illustrate various exemplary embodiments of contact structures 44. The contact structures 44 can have very particular forms. In principle, any desirable form can be used. In order to create a reproducible coupling between the signal waveguide 26 and the coupling waveguide 18 or the signal waveguide 26 and the test probe 28 or the signal waveguide 26 and the coupling waveguide 18 and the test probe 28, the contact structure 44, if said contact structure comprises a material surface, either has holes in which the test probe is positioned, or has a marked geometry on which the test probe is positioned. Alternatively, the contact structure 44 can also be configured as a notch in the substrate.

Figure 14:
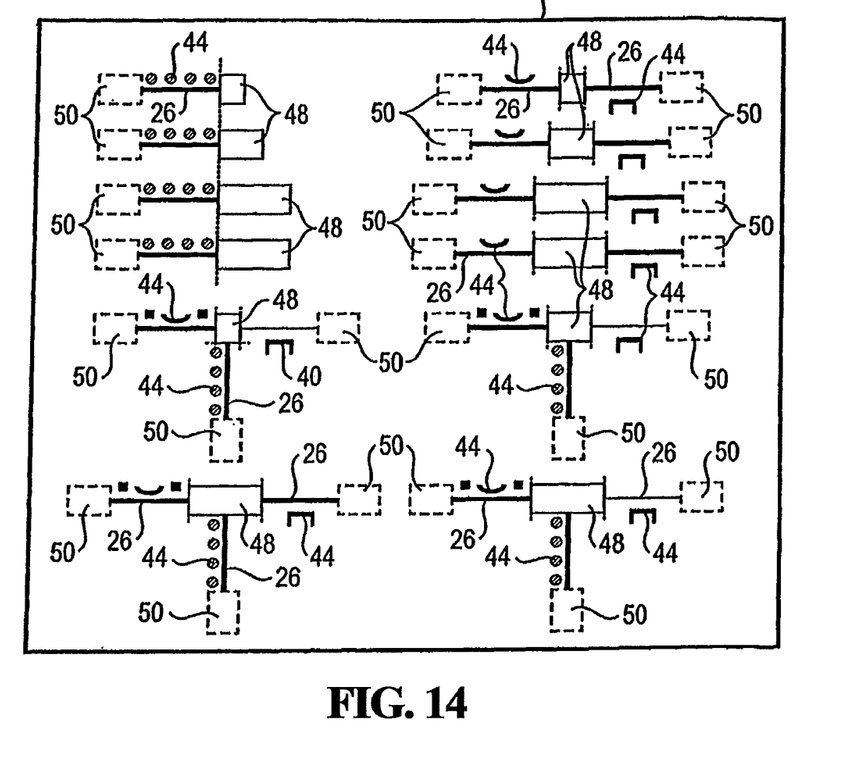
FIG. 14 shows a second preferred embodiment of a calibration substrate according to the invention for the contactless measuring system according to the invention in plan view.

FIG. 14 shows a second preferred embodiment of a calibration substrate according to the invention which is configured on a circuit board 46. Parts with the same function are identified with the same reference numbers as in FIGS. 1 and 4, so that reference is made to the description relating to FIGS. 1 and 4 above for their elucidation. A plurality of calibration elements 48 is arranged on the calibration substrate and each calibration element 48 is connected to one, two or three signal waveguides 26. As distinct from the first embodiment according to FIG. 4, no coupling waveguides are provided on the signal waveguides 26, but rather contact structures 44 as shown in FIGS. 5 to 13. Signals are optionally fed to the signal waveguide 26 at suitable contact sites 50. This calibration substrate comprises different 1-port, 2-port and 3-port calibration standards 48 and different contact structures 44.

Figure 15:
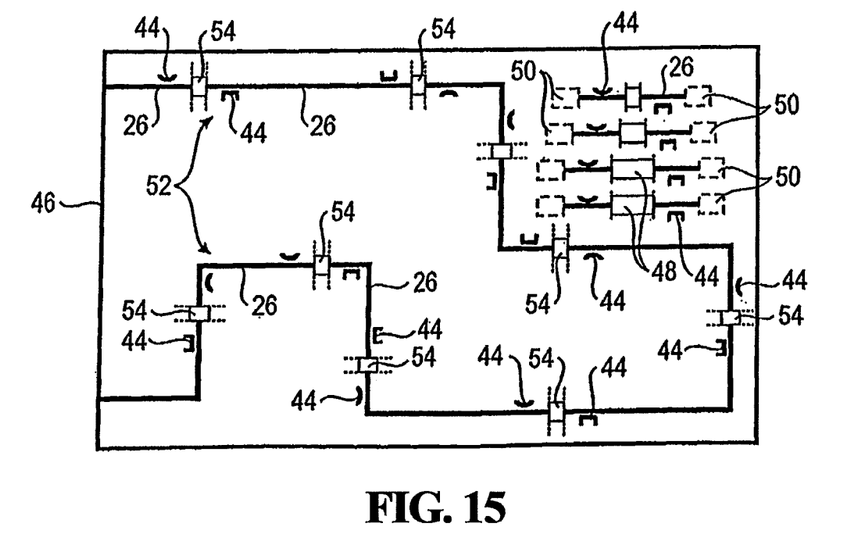
FIG. 15 shows a third preferred embodiment of a calibration substrate according to the invention for the contactless measuring system according to the invention in plan view.

FIG. 15 shows a third preferred embodiment of a calibration standard according to the invention, which is configured on a circuit board 46. Parts with the same function are identified with the same reference signs as in FIGS. 1, 4 and 14, so that reference is made to the description relating to FIGS. 1, 4 and 14 above for their elucidation. In this embodiment, an electronic circuit 52 is also provided with components 54 (DUTs) to be tested on the circuit board 46 of the calibration substrate. Conversely, it can also be said that calibration elements 48 are also arranged on the circuit board 46 with the electronic circuit 52. The contact structure 44 for a particular measuring port on the signal waveguides 26 of the calibration elements are configured identically to the contact structure 44 for this measuring port on the signal waveguides 26 of the electronic circuit 52.

For the correct measurement of the scattering parameters of an N-port test object, the measuring system must be calibrated. Depending on the calibration, M different N-port calibration standards (calibration elements 48), which are known or only partially known, are needed. For calibration using M calibration standards, the geometry and the position of the contact structure and of the signal waveguide 26 must be identical for each measuring port, although it can be different between the N measuring ports If, for example, the scattering parameters of a 2-port object are to be measured, then for an LLR calibration, three 2-port calibration standards are needed. These can be, for example, two lines of different length and two short-circuits, wherein each short-circuit represents a 1-port object, but together correspond to a 2-port object. The three 2-port standards can comprise two different supply lines (signal waveguides 26) per port. The contact structures 44 can also be different on each supply line (each signal waveguide) in terms of position and geometry. However, the signal waveguides 26 and the contact structure 44 must be identical at the respective ports 1 of the calibration standard and the DUTs 48. Also, at the port 2 of the calibration standard, the signal waveguides 26 and the contact structure 44 must match one another, although they can differ from those at the port 1.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A contactless measuring system comprising at least one test probe forming part of a coupling structure for contactless decoupling of a signal running on a signal waveguide, wherein said signal waveguide is configured as a conductor track and as part of an electrical circuit on a circuit board, such that at least one contact structure is configured and arranged on the circuit board, galvanically separated from the signal waveguide, forming part of the coupling structure, arranged completely within a near field of the signal waveguide, and comprising at least one contact point which can be electrically contacted by a contact of said at least one test probe, and including at least one calibration element arranged on the circuit board, which is connected to the signal waveguide on which said at least one contact structure is arranged such that the arrangement of the at least one contact structure on the signal waveguide of said at least one calibration element corresponds to the arrangement of the at least one contact structure on the signal waveguides of the electrical circuit.

2. The contactless measuring system of claim 1, including having said at least one calibration element comprise a short-circuit standard, an open circuit standard, a resistance standard, or a conductor standard, or a combination thereof, on the circuit board.

3. The contactless measuring system of claim 2, including a number of measuring ports, wherein said at least one calibration element is connected to a number of signal waveguides which corresponds to the number of measuring ports of the contactless measuring system.

4. The contactless measuring system of claim 2 wherein said at least one contact structure is on the at least one signal waveguide of said at least one calibration element, said contact structure being in electrical communication with a measuring port of the contactless measuring system, configured identically to the at least one contact structure on the signal waveguides of the electrical circuit, said at least one contact structure being assigned to said measuring port of the contactless measuring system.

5. The contactless measuring system of claim 1, including a number of measuring ports, wherein said at least one calibration element is connected to a number of signal waveguides which corresponds to the number of measuring ports of the contactless measuring system.

6. The contactless measuring system of claim 5 wherein said at least one contact structure is on the signal waveguide of said at least one calibration element, said contact structure being in electrical communication with one of said number of measuring ports of the contactless measuring system, configured identically to the at least one contact structure on the signal waveguides of the electrical circuit.

7. A calibration substrate for a contactless measuring system, comprising;
   at least one test probe which forms part of a coupling structure for contactless decoupling of a signal running on a signal waveguide;
   at least one calibration element, in particular a short-circuit standard, an open circuit standard, a resistance standard, or a conductor standard, provided on the calibration substrate;
   at least one signal waveguide electrically connected to the at least one calibration element; and
   wherein in the calibration substrate is configured as a circuit board on which at least one contact structure is configured and arranged such that said at least one contact structure is galvanically separated from the at least one signal waveguide, forms part of the coupling structure, is arranged completely within a near field of the at least one signal waveguide, and comprises at least one contact point which can be electrically contacted by a contact of the at least one test probe.

8. The calibration substrate of claim 7, wherein said at least one calibration element is arranged on the calibration substrate and connected to said signal waveguide, and wherein said contactless measuring system includes a measuring port such that the calibration substrate is assigned thereto.

9. The calibration substrate of claim 8, including having the at least one contact structure on the signal waveguide of the at least one calibration element, said at least one contact structure being assigned to a measuring port of the contactless measuring system, configured identically to the at least one contact structure on the at least one signal waveguide of the electrical circuit, said at least one contact structure being assigned to said measuring port of the contactless measuring system.

10. The calibration substrate according to claim 9, wherein said at least one calibration element is connected to a number of signal waveguides which corresponds to a measuring port of the contactless measuring system, wherein said at least one calibration element is connected to said signal waveguide which corresponds to said measuring port of the contactless measuring system.

11. The calibration substrate according to claim 8, wherein said at least one calibration element is connected to said at least one signal waveguide which corresponds to said measuring port of the contactless measuring system.

12. The calibration substrate of claim 7, including at least one electrical circuit with at least one signal waveguide and at least one device under test to be tested on the circuit board of the calibration substrate, arranged on the circuit board of the calibration substrate, and the at least one contact structure arranged on said at least one signal waveguide such that the arrangement of the at least one contact structure on the at least one signal waveguide of the at least one electrical circuit corresponds to the arrangement of contact structures on the at least one signal waveguide of a calibration element.

13. The calibration substrate of claim 12, wherein said at least one contact structure on the at least one signal waveguide of said at least one calibration element, said at least one contact structure being assigned to a measuring port of the contactless measuring system, configured identically to the at least one contact structure on the calibration substrate on the at least one signal waveguide of the electrical circuit, said at least one contact structure being assigned to said measuring port of the contactless measuring system.

* * * * *